(12) United States Patent
Roohparvar et al.

(10) Patent No.: US 8,578,244 B2
(45) Date of Patent: *Nov. 5, 2013

(54) PROGRAMMING ERROR CORRECTION CODE INTO A SOLID STATE MEMORY DEVICE WITH VARYING BITS PER CELL

(71) Applicant: Micron Technology, Inc, Boise, ID (US)

(72) Inventors: Frankie F. Roohparvar, Monte Sereno, CA (US); Vishal Sarin, Saratoga, CA (US); Jung S. Hoei, Newark, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/633,158

(22) Filed: Oct. 2, 2012

(65) Prior Publication Data

US 2013/0024736 A1 Jan. 24, 2013

Related U.S. Application Data

(60) Continuation of application No. 13/345,896, filed on Jan. 9, 2012, now Pat. No. 8,291,271, which is a division of application No. 13/195,977, filed on Aug. 2, 2011, now Pat. No. 8,103,940, which is a continuation of application No. 11/761,608, filed on Jun. 12, 2007, now Pat. No. 8,006,166.

(51) Int. Cl.
*G11C 29/00* (2006.01)
*G11C 5/14* (2006.01)
*H03M 13/00* (2006.01)
*G06F 11/00* (2006.01)

(52) U.S. Cl.
USPC ........... 714/768; 714/718; 714/764; 714/774; 714/799; 365/185.09; 365/201

(58) Field of Classification Search
USPC .................. 714/768, 718, 764, 774, 799; 365/189.09, 201
See application file for complete search history.

(56) References Cited

U.S. PATENT DOCUMENTS

| | | | |
|---|---|---|---|
| 4,866,719 A * | 9/1989 | Morgan et al. | ................ 714/704 |
| 6,079,037 A | 6/2000 | Beffa et al. | |
| 6,442,719 B1 | 8/2002 | Beffa et al. | |

(Continued)

FOREIGN PATENT DOCUMENTS

EP 0 802 540 A2 10/1997
WO WO 2006/013529 A1 2/2006

*Primary Examiner* — John J Tabone, Jr.
(74) *Attorney, Agent, or Firm* — Leffert Jay & Polglaze, P.A.

(57) ABSTRACT

Memory devices that, in a particular embodiment, receive and transmit analog data signals representative of bit patterns of two or more bits such as to facilitate increases in data transfer rates relative to devices communicating data signals indicative of individual bits. Programming error correction code (ECC) and metadata into such memory devices includes storing the ECC and metadata at different bit levels per cell based on an actual error rate of the cells. The ECC and metadata can be stored with the data block at a different bit level than the data block. If the area of memory in which the block of data is stored does not support the desired reliability for the ECC and metadata at a particular bit level, the ECC and metadata can be stored in other areas of the memory array at different bit levels.

20 Claims, 7 Drawing Sheets

(56) References Cited

U.S. PATENT DOCUMENTS

| | | | |
|---|---|---|---|
| 6,657,891 B1 | 12/2003 | Shibata et al. | |
| 7,257,032 B2 | 8/2007 | Fujiu et al. | |
| 7,275,190 B2 * | 9/2007 | Roohparvar | 714/723 |
| 7,400,532 B2 | 7/2008 | Aritome | |
| 7,450,417 B2 | 11/2008 | Kaneko et al. | |
| 7,460,398 B1 | 12/2008 | Roohparvar et al. | |
| 7,460,402 B2 | 12/2008 | Shibata | |
| 7,593,267 B2 | 9/2009 | Fujiu et al. | |
| 7,650,541 B2 * | 1/2010 | Roohparvar | 714/723 |
| 7,768,830 B2 | 8/2010 | Shibata et al. | |
| 7,813,171 B2 | 10/2010 | Shibata et al. | |
| 7,916,536 B2 * | 3/2011 | Roohparvar et al. | 365/185.03 |
| 8,006,166 B2 * | 8/2011 | Roohparvar et al. | 714/768 |
| 8,103,940 B2 * | 1/2012 | Roohparvar et al. | 714/768 |
| 8,281,182 B2 * | 10/2012 | Resch et al. | 714/6.2 |
| 8,291,271 B2 * | 10/2012 | Roohparvar et al. | 714/718 |
| 2002/0004921 A1 * | 1/2002 | Muranaka et al. | 714/704 |
| 2003/0217323 A1 * | 11/2003 | Guterman et al. | 714/763 |
| 2004/0113199 A1 | 6/2004 | Hazama et al. | |
| 2004/0205426 A1 * | 10/2004 | Muranaka et al. | 714/704 |
| 2005/0086574 A1 | 4/2005 | Fackenthal | |
| 2006/0098484 A1 * | 5/2006 | Roohparvar | 365/185.09 |
| 2007/0121392 A1 | 5/2007 | Nawaki | |
| 2007/0168840 A1 * | 7/2007 | Roohparvar | 714/770 |
| 2008/0189481 A1 * | 8/2008 | Mayer et al. | 711/111 |
| 2008/0310225 A1 * | 12/2008 | Roohparvar | 365/185.03 |
| 2008/0313493 A1 * | 12/2008 | Roohparvar et al. | 714/6 |
| 2011/0242890 A1 | 10/2011 | Shibata et al. | |

* cited by examiner

PROGRAMMING ERROR CORRECTION CODE INTO A SOLID STATE MEMORY DEVICE WITH VARYING BITS PER CELL

RELATED APPLICATION

This is a Continuation of U.S. application Ser. No. 13/345,896 titled "PROGRAMMING ERROR CORRECTION CODE INTO A SOLID STATE MEMORY DEVICE WITH VARYING BITS PER CELL," filed Jan. 9, 2012, now U.S. Pat. No. 8,291,271, which is a Divisional of U.S. application Ser. No. 13/195,977, filed Aug. 2, 2011, now U.S. Pat. No. 8,103,940, which is a Continuation of U.S. application Ser. No. 11/761,608 filed Jun. 12, 2007, now U.S. Pat. No. 8,006,166, which are commonly assigned and incorporated herein by reference.

TECHNICAL FIELD

The present disclosure relates generally to semiconductor memory and, in a particular embodiment, the present disclosure relates to solid state non-volatile memory devices.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, cellular telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
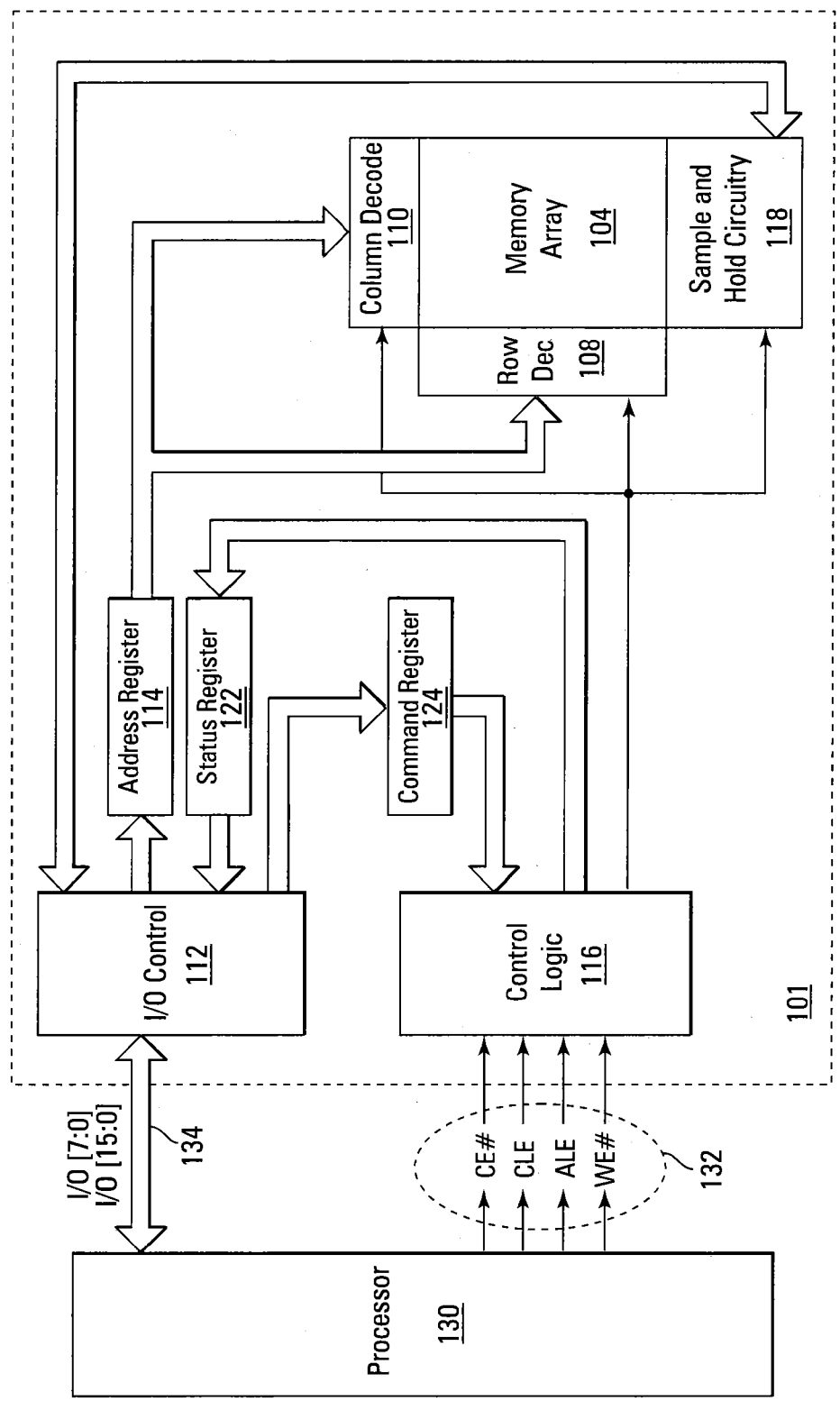
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage ($V_t$) ranges of 200 mV for each range, with each range corresponding to a distinct data state, thereby representing four data values or bit patterns. Typically, a dead space or margin of 0.2V to 0.4V is between each range to keep the $V_t$ distributions from overlapping. If the $V_t$ of the cell is within the first range, the cell may be deemed to store a logical 11 state and is typically considered the erased state of the cell. If the $V_t$ is within the second range, the cell may be deemed to store a logical 10 state. If the $V_t$ is within the third range, the cell may be deemed to store a logical 00 state. And if the $V_t$ is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the $V_t$ of the target memory cell is moved from the $V_t$ range corresponding to the 11 logic state to the $V_t$ range corresponding to the 10 logic state. Following programming of the LSBs, the most-significant bit (MSB) of each cell is programmed in a similar manner, shifting the $V_t$ where necessary. When reading an MLC of a traditional memory device, one or more read operations determine generally into which of the ranges the $V_t$ of the cell voltage falls. For example, a first read operation may determine whether the $V_t$ of the target memory cell is indicative of the MSB being a 1 or a 0 while a second read operation may determine whether the $V_t$ of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as $V_t$ ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their $V_t$ levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the $V_t$ levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
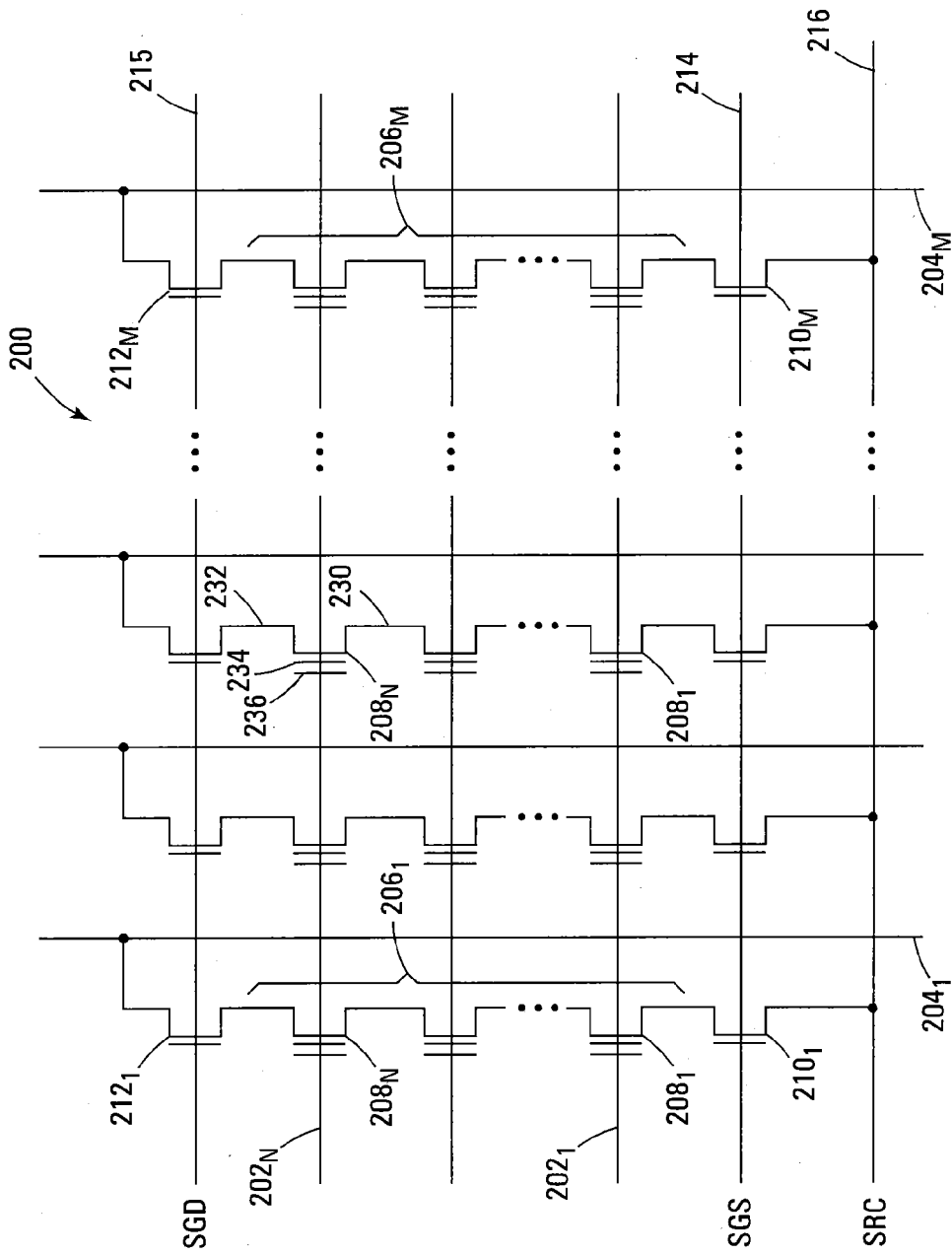
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor 2081 of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
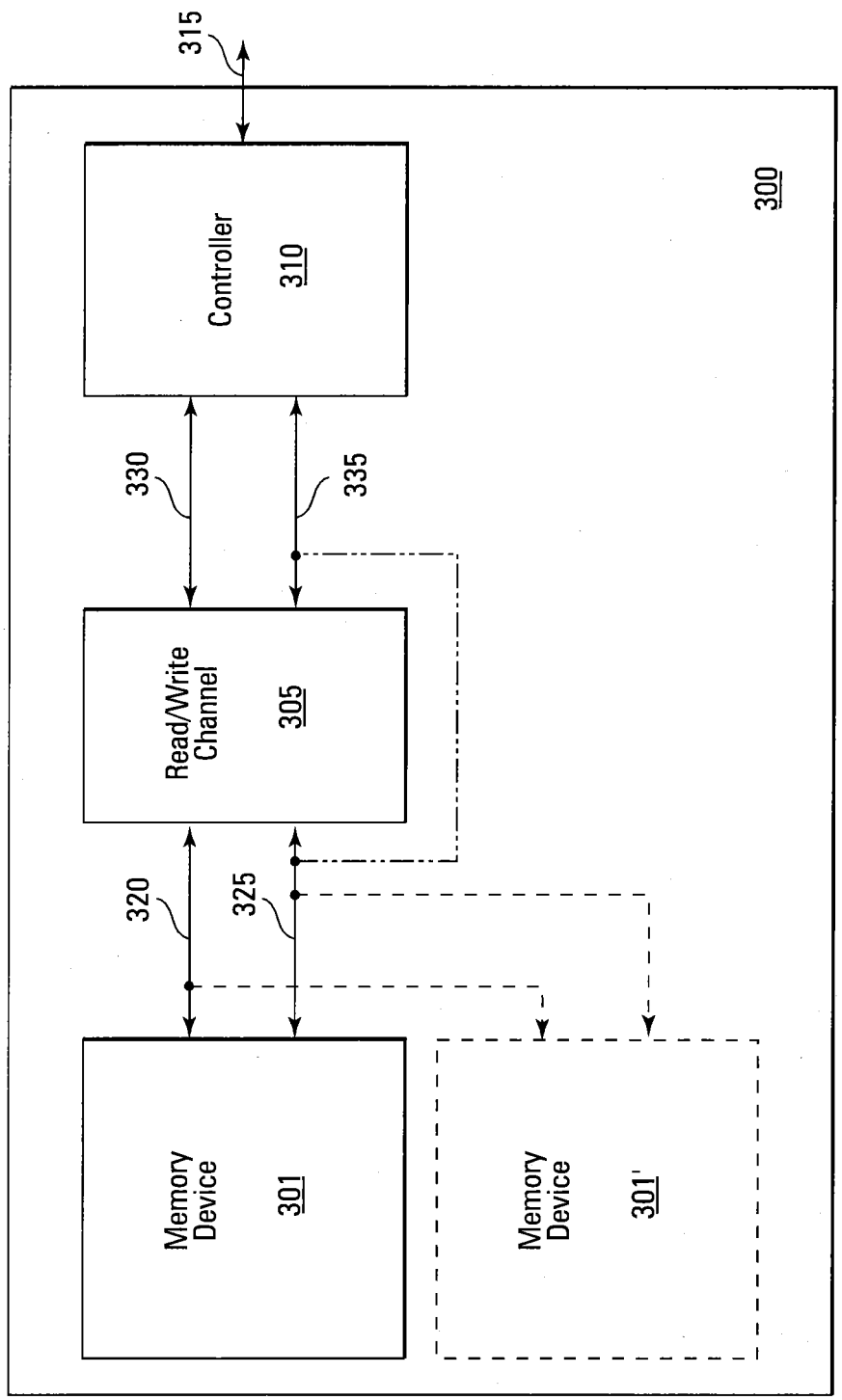
FIG. 3 is a block schematic of a solid state bulk storage system in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
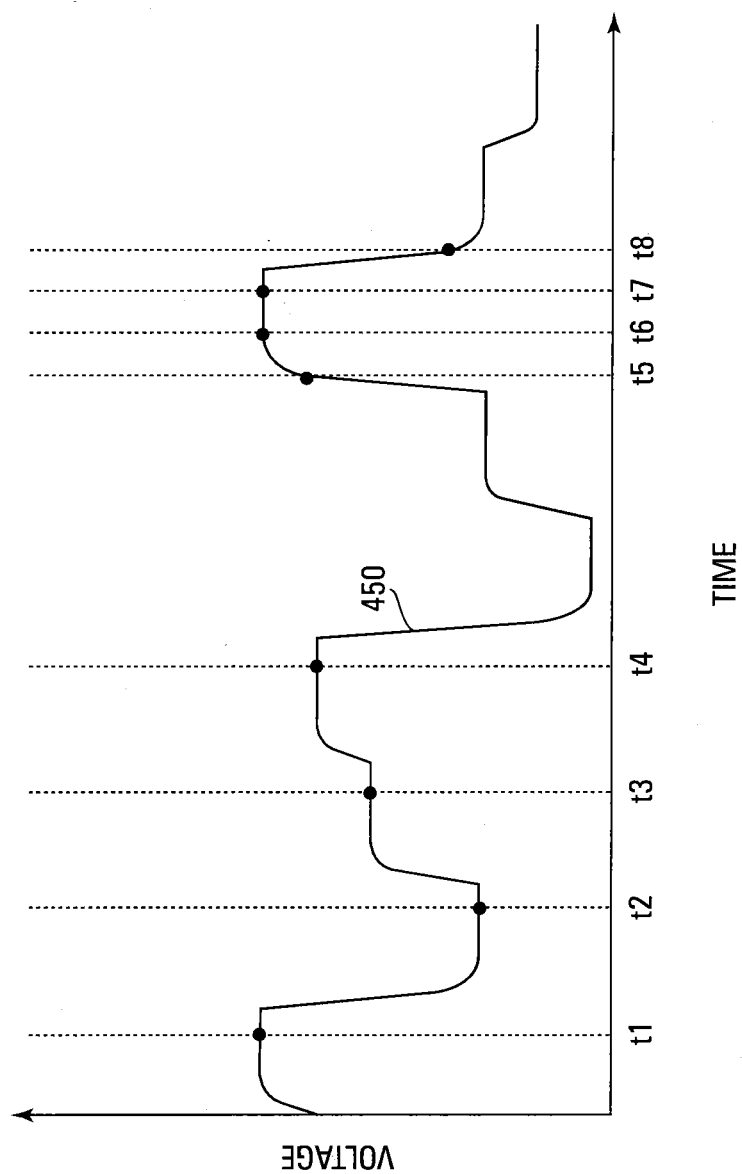
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
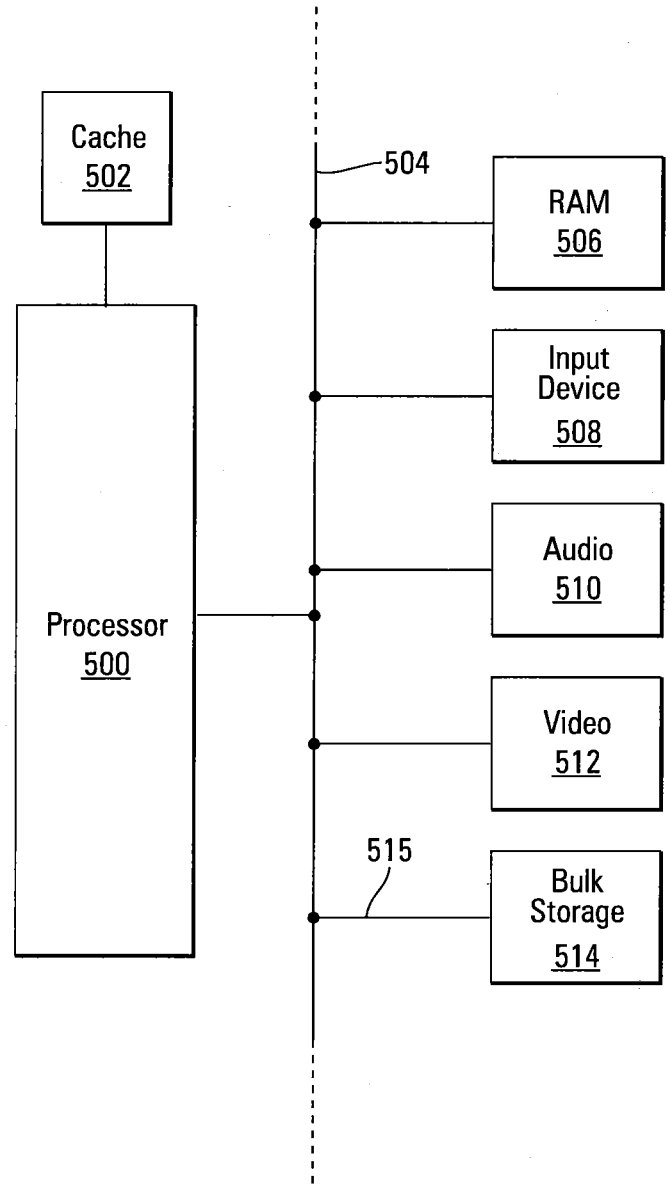
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

Due to slight differences in the composition of each cell during the manufacturing process, the reliability of bit storage and memory performance (e.g., programming and erase speed) can vary from cell-to-cell or block-to-block across the memory array. Additionally, this variation may be different between different integrated circuit dies such that two memory devices do not share the same reliability and performance characteristics.

The performance and reliability of a state being stored can be different based on the threshold voltage (corresponding to a programmed state) assigned to the memory cell. For example, some cells may be able to be programmed with and retain larger threshold voltages, and therefore more bits/states, than other cells. Similarly for performance, some cells may be programmed or erased more quickly than other cells.

Reliability issues are more critical in multilevel cells (MLC) of non-volatile memories due to the reduced spacing between adjacent programmed levels. As more states are capable of being programmed into a memory cell, the threshold distributions must become narrower and closer together in order to fit in the allowable voltage range. This can result in an increased number of bit errors due to interference between programmed states. Thus, some type of on-chip error correction code (ECCs) is typically used in large-capacity non-volatile memories.

MLC NAND non-volatile memories typically use ECC schemes that are fairly complex. ECCs commonly used in memory devices include single error correction Hamming codes, symbol based Reed Solomon (RS) codes, and Binary BCH codes. The ECC data is stored in memory along with the block of data to which the ECC data is assigned. However, since there are no mechanisms for correcting ECC, it is desirable for the ECC data to be stored in a very reliable area of memory. The controller can be calibrated to the reliability of various areas of the memory array and then change the bit level (e.g., the number of bits per cell) of the ECC data programmed into those areas based on the calibration data and the desired level of reliability.

Figure 6:
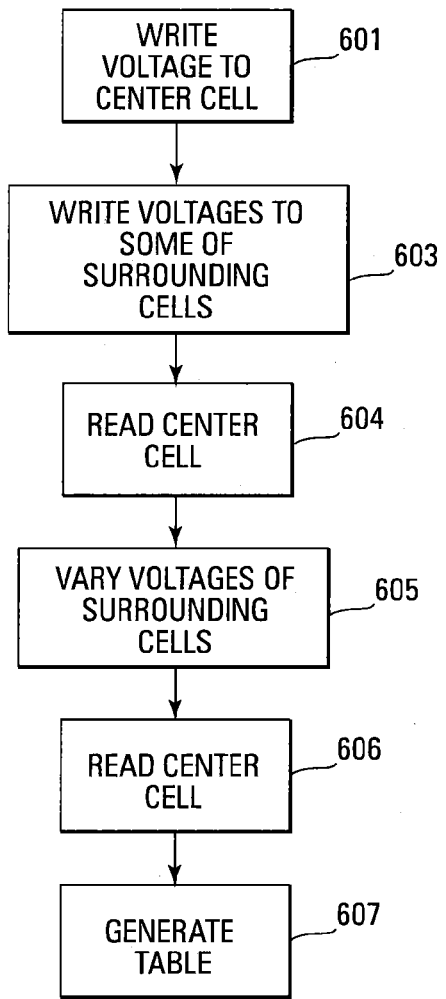
FIG. 6 is a flowchart of one embodiment of a method for calibrating a controller circuit to reliability characteristics of a specific memory device.

FIG. 6 illustrates a flowchart of one embodiment of a method for calibrating a memory controller to the reliability of areas of a memory array. Reference is made to the block diagram of the area of a memory cell array of FIG. 7 while discussing the method of FIG. 6.

The calibration method writes a voltage 601 to the center memory cell 701. The voltage is a threshold voltage that represents a programmed state such as a single bit state or a multiple bit state. As discussed previously, the threshold voltage can be generated by the control circuit, coupled to and controlling the memory device, as a digital signal representative of the desired threshold voltage. A read/write channel circuit then performs a digital-to-analog conversion on the digital signal to produce the analog representation of the desired threshold voltage.

A bit pattern represented by another analog voltage is written 603 to one or more of the surrounding memory cells 703, 705. The center cell 701 is then read 604 to determine the extent to which the writing of the surrounding voltages has affected the center cell's stored voltage. The voltage on these cells 703, 705 is then varied 605, typically increased, and the center cell is read after each change 606 to determine the effect on the center cell 701. An indication of the reliability of the center cell 701 is stored in a table 607 in memory for future reference. The table contains an indication of each tested cell's ability to retain an initially stored value and, therefore, how reliable that cell is at storing different bit levels. In one embodiment, the indication of reliability is a logical one at each tested bit level indicating that the tested cell is reliable at that particular bit level and a logical zero indicating that the cell is not reliable at that particular bit level.

The quantity and orientation of the programmed cells that surround the center cell 701 can vary for different embodiments. The cells adjacent to the center cell 701 and in the word line direction can affect the center cell by both capacitive coupling and by program disturb. Since the cells 701, 703, 705 all share the same word line, repeated biasing of the word line with different, and especially higher, programming voltages will probably affect the threshold voltage of the center cell 701 to some extent.

Programming of the cells along the bit line direction 710, 711 will likely affect the threshold voltage on the center cell 701 by capacitive coupling. The coupling of the adjacent bit line cells 710, 711 will tend to raise the threshold voltage of the center cell 701 due to the coupling between the cells 701, 710, 711 as higher voltages are programmed on the adjacent cells 710, 711.

Figure 7:
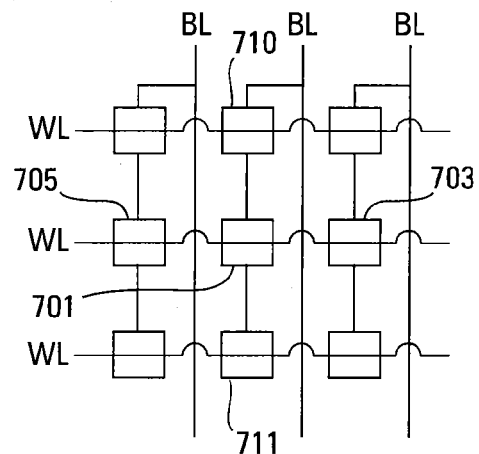
FIG. 7 is a block diagram of one embodiment of a sub-portion of a memory array in accordance with the method of FIG. 6.

The calibration method illustrated in FIGS. 6 and 7 is performed on representative cells of different areas of the memory array. The method can be performed on random cells of the entire memory array or in specific areas of the array. For example, the method may be performed on the corner cells of the array and in the center. In another embodiment, certain areas of each memory block can be checked. In still another embodiment, the method can be performed on cells located at periodic intervals within the memory array.

The calibration can be performed once during the manufacturing process and the reliability indications stored in non-volatile memory. In another embodiment, the calibration is performed at every power-up of the memory device.

Memory devices such as the non-volatile memory devices presently disclosed, can use metadata to store information regarding memory cells, pages, or blocks. The memory metadata includes data regarding performance characteristics of a block of data, the number of times a block has been erased, as well as other characteristics regarding a cell, page of cells, or block of cells.

Figure 8:
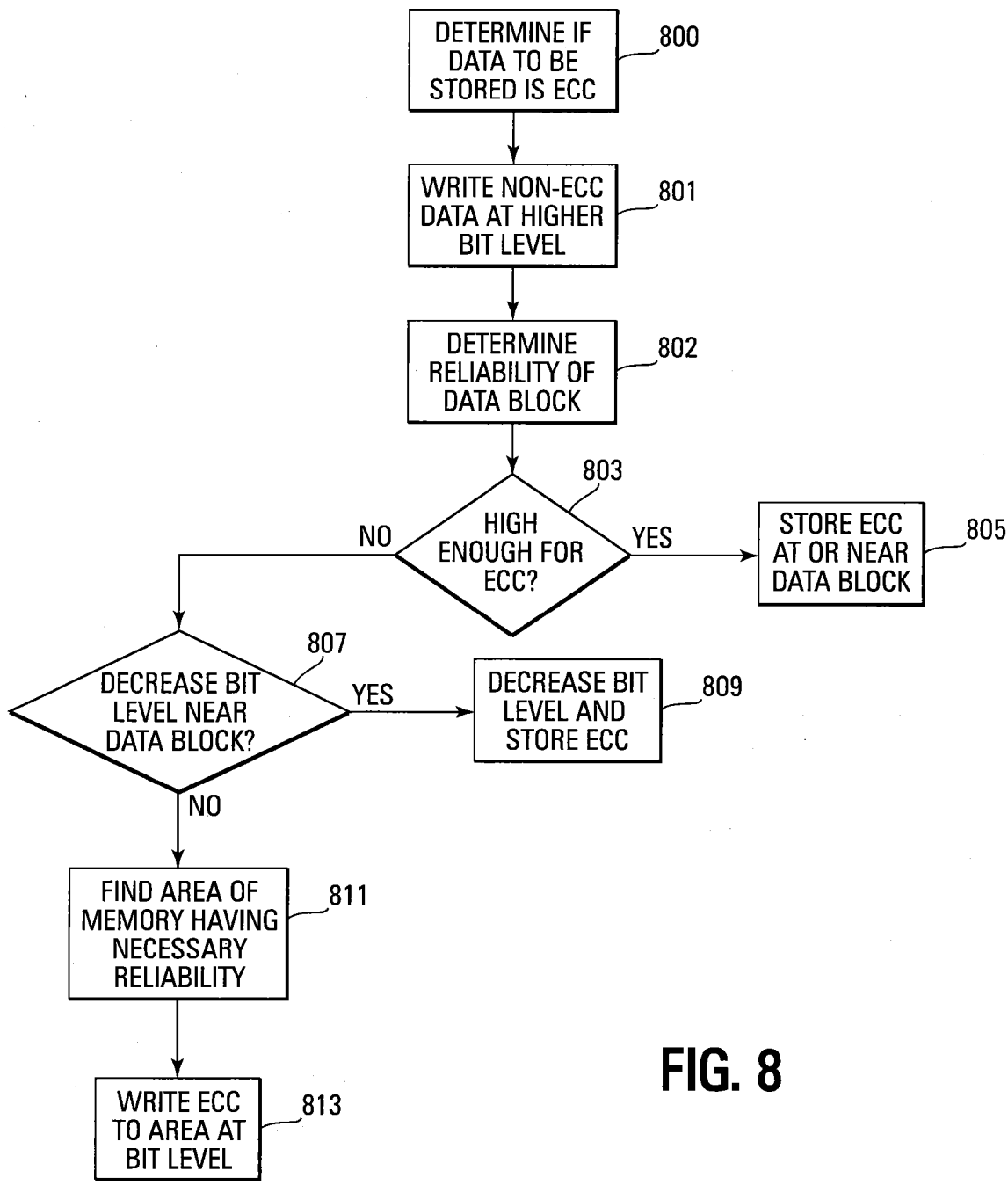
FIG. 8 is a flowchart of one embodiment of a method for programming error correction code into a memory device by varying the bit level per cell in response to an actual error rate.

FIG. 8 illustrates a flowchart of a method for programming error correction code (ECC) and/or metadata into a memory device by varying the bit level per cell in response to an actual error rate. The ECC and metadata can be stored either next to the block of data to which it applies or anywhere else in memory if, for example, that location has not been shown to be reliable enough by the calibration steps previously discussed. Subsequent reference to memory blocks are for purposes of illustration only. The present methods can apply to other sub-sections of a memory array (e.g., page).

Initially, it is determined if the data to be stored is ECC, metadata, or another type of data 800. Since there are no mechanisms to correct ECC, it should be stored in an area of higher reliability than other types of data that can be corrected through the ECC scheme. Non-ECC data can be written to a memory block at a higher bit level than ECC 801 since errors can be corrected by the ECC mechanism. For example, the higher bit level can be two or more bits per cell.

The reliability of the memory block is determined 802. This can be accomplished by using the calibration data such as data stored in a table such as that discussed with respect to FIG. 6. In an alternate embodiment, the memory block can be tested independently at varying bit levels to determine the ability of that particular area of memory to reliably hold data at different bit levels.

The ECC/metadata for the block of data should be stored in an area of memory that is able to store the data without loss or corruption. If the reliability of the memory area containing the block of data is determined to be reliable for the ECC/metadata 803 at the memory block bit level, the data is stored in or substantially near the block of data 805 at the memory block bit level (i.e., the number of bits per cell for the memory block).

If the memory block bit level is not reliable to store ECC/metadata at the data block's bit level, it is determined if the reliability of the memory block can be increased by decreasing the bit level of the cells in the memory block 807. This can be determined as described previously by accessing the calibration data or, accessing reliability data determined in step 801.

If decreasing the bit level of the memory block increases the reliability of the memory block so that it can be used for ECC/metadata, the bit level is decreased for the ECC and it is written to the memory block or substantially near the memory block at that bit level 809. If decreasing the bit level does not produce an acceptable ECC reliability 807, another area of memory is used to store the ECC for that block of data.

The area of memory in which the ECC/metadata is to be stored can be determined 811 by the above-described methods. For example, either the calibration data can be used to determine an appropriately reliable area of memory for the ECC/metadata or different areas of the memory can be independently tested at different bit levels to determine their respective reliabilities at different bit levels. Once the area of memory is found that exhibits the desired reliability level for ECC/metadata, the ECC/metadata is written to that area at a bit level that corresponds to the desired level of reliability 813.

Once the block of data and accompanying ECC/metadata are written to different areas of memory, the two can be linked in some manner so that their locations and association can be tracked. For example, the system controller can store the addresses of both the block of data and its respective ECC/metadata and also store the indication that the two are linked.

CONCLUSION

The ability to store ECC/metadata at different bit levels per cell depending on the actual error rate of cells can be provided. A calibration procedure can be used to determine the reliability or error rate of different areas of the memory array in response to different bit levels. This data can be stored in memory that is accessible by a system controller in order to determine in which areas of the memory array to store the ECC/metadata such that reliable storage is achieved at a particular bit level.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method comprising:
    determining a level of reliability of an area of a memory array in which a block of data is stored; and
    storing metadata associated with the block of data in one of the area of the memory array in which the block of data is stored or an area of the memory array near the area of memory array in which the block of data is stored in response to the level of reliability of the area of the memory array in which the block of data is stored being at least substantially equal to a desired level of reliability for the metadata.

2. A device, comprising:
    an array of memory cells; and
    control circuitry coupled to the array of memory cells wherein the control circuitry is configured to program metadata for a block of data by determining a desired level of reliability for the metadata, determining a memory area level of reliability, at a bit level, for a memory area of the array of memory cells in which the block of data is stored, storing the metadata with the block of data and at the bit level if the memory area level of reliability is at least substantially equal to the desired level of reliability, and storing the metadata to another area of the array of memory cells if the memory area level of reliability is less than the desired level of reliability.

3. A method comprising:
    calibrating a controller to a reliability of an area of a memory array; and
    changing a bit level of ECC data and/or metadata programmed into the area of the memory array based on the calibration and a desired level of reliability.

4. The method of claim 3 wherein calibrating the controller to a reliability of an area of the memory array comprises:
    writing a first voltage to a center memory cell;
    writing a second voltage to memory cells surrounding the center memory cell;
    reading the center memory cell at a first time;
    varying threshold voltages of the surrounding memory cells;
    reading the center memory cell at a second time; and
    generating a table comprising an indication of an ability of the center memory cell to retain the first voltage responsive to the varying of the threshold voltages of the surrounding memory cells.

5. The method of claim 3, wherein calibrating the controller comprises storing calibration data in memory that is accessible by the controller.

6. The method of claim 5, wherein the memory that is accessible by the controller is the memory array.

7. The method of claim 3, wherein calibrating the controller comprises performing a calibration method on representative memory cells of different areas of the memory array.

8. The method of claim 3, wherein calibrating the controller comprises calibrating the controller at power-up of a memory device including the memory array.

9. The method of claim 3, wherein changing the bit level comprises programming ECC data into the area of the memory array at a bit level per memory cell determined by an actual error rate of the area.

10. The method of claim 3, wherein changing the bit level comprises programming metadata into the area of the memory array at a bit level per memory cell determined by an actual error rate of the area.

11. A method comprising:
    determining a respective error rate for each of a plurality of areas of a memory array; and
    determining in which of the plurality of areas to store ECC data and/or metadata based on the determined respective error rates.

12. The method of claim 11, wherein determining the respective error rate comprises accessing calibration data from a table in memory.

13. The method of claim 11, wherein determining the respective error rate comprises performing a calibration method on representative memory cells of the plurality of areas of the memory array.

14. A method comprising:
    determining an actual error rate of a memory cell in an area of a memory array; and storing ECC data and/or metadata in the area of the memory array at a bit level per memory cell determined by the actual error rate of the memory cell.

15. A device comprising:
an array of memory cells; and
control circuitry coupled to the array of memory cells wherein the control circuitry is configured to calibrate a controller to a reliability of an area of the array of memory cells and change a bit level of ECC data and/or metadata programmed into the area of the array of memory cells based on the calibration and a desired level of reliability.

16. The device of claim 15, wherein the control circuitry is further configured to control calibration of the controller by controlling writing a first voltage to a center memory cell of the array of memory cells, writing a second voltage to memory cells surrounding the center memory cell, reading the center memory cell at a first time, varying threshold voltages of the surrounding memory cells, reading the center memory cell at a second time, and generating a table comprising an indication of an ability of the center memory cell to retain the first voltage responsive to the varying of the threshold voltages of the surrounding memory cells.

17. The device of claim 16, wherein the control circuitry is further configured to calibrate the controller by storing calibration data in memory that is accessible by the controller.

18. The device of claim 17, wherein the memory that is accessible by the controller is the memory array.

19. A device comprising:
an array of memory cells; and
control circuitry coupled to the array of memory cells wherein the control circuitry is configured to determine a respective error rate for each of a plurality of areas of the array of memory cells and determine in which of the plurality of areas to store ECC data and/or metadata based on the determined respective error rates.

20. A device comprising:
an array of memory cells; and
control circuitry coupled to the array of memory cells wherein the control circuitry is configured to determine an actual error rate of a memory cell in an area of the array of memory cells and store ECC data and/or metadata in the area of the array of memory cells at a bit level per memory cell determined by the actual error rate of the memory cell.

* * * * *